United States Patent
De Poorter et al.

(10) Patent No.: US 7,392,448 B2
(45) Date of Patent: Jun. 24, 2008

(54) METHOD AND APPARATUS FOR DETERMINING STUCK-AT FAULT LOCATIONS IN CELL CHAINS USING SCAN CHAINS

(75) Inventors: Alexandre De Poorter, Trets (FR); Fabrice Picot, Pourcieux (FR)

(73) Assignee: Atmel Corporation, San Jose, CA (US)

( * ) Notice: Subject to any disclaimer, the term of this patent is extended or adjusted under 35 U.S.C. 154(b) by 131 days.

(21) Appl. No.: 11/207,082

(22) Filed: Aug. 17, 2005

(65) Prior Publication Data

US 2007/0022340 A1 Jan. 25, 2007

(30) Foreign Application Priority Data

Jul. 1, 2005 (FR) .................................. 05 07050

(51) Int. Cl.
*G01R 31/28* (2006.01)
(52) U.S. Cl. ........................................ 714/726; 714/734
(58) Field of Classification Search ...................... None
See application file for complete search history.

(56) References Cited

U.S. PATENT DOCUMENTS

| | | | |
|---|---|---|---|
| 5,903,466 A | 5/1999 | Beausang et al. | |
| 6,157,210 A | 12/2000 | Zaveri et al. | |
| 6,453,436 B1 | 9/2002 | Rizzolo et al. | |
| 6,481,000 B1 | 11/2002 | Zaveri et al. | |
| 6,490,702 B1 | 12/2002 | Song et al. | |
| 6,526,562 B1 | 2/2003 | Haddad et al. | |
| 6,536,007 B1 | 3/2003 | Venkataraman | |
| 6,539,536 B1 | 3/2003 | Singh et al. | |
| 6,546,526 B2 | 4/2003 | Lai et al. | |
| 6,587,981 B1 | 7/2003 | Muradali et al. | |
| 6,694,454 B1 | 2/2004 | Stanley | |
| 6,701,476 B2* | 3/2004 | Pouya et al. ................. | 714/727 |
| 2003/0023941 A1 | 1/2003 | Wang et al. | |
| 2005/0166108 A1* | 7/2005 | Huisman et al. ............. | 714/726 |
| 2005/0172192 A1* | 8/2005 | Han ........................... | 714/726 |
| 2005/0283690 A1* | 12/2005 | McLaurin ................... | 714/726 |

FOREIGN PATENT DOCUMENTS

| | | | |
|---|---|---|---|
| DE | 10116746 A | * | 4/2001 |
| JP | 2006329876 A | * | 12/2006 |

* cited by examiner

*Primary Examiner*—Cynthia Britt
(74) *Attorney, Agent, or Firm*—Sawyer Law Group LLP

(57) ABSTRACT

Methods and apparatus are provided for testing digital circuits. In one implementation, a scan chain test structure is provided that includes a cell chain, a first scan chain, and a second scan chain. The first scan chain is operable to test digital circuitry within a first portion of the cell chain, and the second scan chain is operable to test digital circuitry within a second portion of the cell chain. The first scan chain is further operable to test digital circuitry within the second scan chain, and the second scan chain is further operable to test digital circuitry within the first scan chain.

18 Claims, 9 Drawing Sheets

METHOD AND APPARATUS FOR DETERMINING STUCK-AT FAULT LOCATIONS IN CELL CHAINS USING SCAN CHAINS

CROSS-REFERENCE TO RELATED APPLICATIONS

This application claims benefit under 35 USC 119 of French patent application serial number 0507050, filed on Jul. 1, 2005.

FIELD OF THE INVENTION

The present invention relates generally to testing the presence of faults in digital circuits.

BACKGROUND OF THE INVENTION

Functional testing of the operation of digital circuits is generally implemented through the use of scan chains. A scan chain is typically composed of a chain of latches (e.g., flip flops) that are coupled to an input and an output of a digital circuit.

To test a digital circuit, a test input of known values, for example, a pre-determined string of "1"'s and "0"'s, are first serially scanned (or loaded) into a scan chain. The test input is transferred from the scan chain into the digital circuit, and propagated through the digital circuit. If there is a defect in the digital circuit, an incorrect result will be recovered from an output of the digital circuit. Common defects in digital circuits include faults such as stuck-at faults—e.g., stuck-at "0" or stuck-at "1".

A typical problem associated with scan chains is that incorrect values may be loaded into a scan chain—e.g., due to a defect in a latch associated with the scan chain. The incorrect values within a scan chain can degrade testing performance of digital circuits.

Accordingly, what is needed is an improved technique that permits testing for the correct operation of digital circuitry—even when a scan chain includes one or more defective latches. The present invention addresses such a need.

BRIEF SUMMARY OF THE INVENTION

In general, in one aspect, this specification describes a scan chain structure. The scan chain test structure includes a cell chain, a first scan chain, and a second scan chain. The first scan chain is operable to test digital circuitry within a first portion of the cell chain, and the second scan chain is operable to test digital circuitry within a second portion of the cell chain. The first scan chain is further operable to test digital circuitry within the second scan chain, and the second scan chain is further operable to test digital circuitry within the first scan chain.

Particular implementations can include one or more of the following features. The first scan chain can be operable to further test digital circuitry within the second portion of the cell chain, and the second scan chain can be further operable to test digital circuitry within the first portion of the cell chain. The digital circuitry within the cell chain can include digital circuitry associated with one or more of microcontrollers, memories, logic, radio frequency (RF) components, or sensors. The cell chain can include a multiplexer to switch the cell chain between a normal mode of operation and a cell chain test mode of operation. The first scan chain and the second scan chain can each include a multiplexer to respectively switch the first scan chain and the second scan chain between the cell chain test mode of operation and a scan chain test mode of operation. Sizes of the first scan chain and the second scan chain can be scalable to match a total number of circuits to be tested within the cell chain.

In general, in another aspect, this specification describes a test system. The test system includes a central processing unit and a memory coupled to the central processing unit. The memory is operable to store one or more test inputs of a pre-determined length. The test system further includes a scan test interface coupled to a printed circuit board that includes a scan chain test structure. The scan chain test structure includes a cell chain, a first scan chain, and a second scan chain. The first scan chain is operable to test digital circuitry within a first portion of the cell chain, and the second scan chain is operable to test digital circuitry within a second portion of the cell chain. The first scan chain is further operable to test digital circuitry within the second scan chain, and the second scan chain is further operable to test digital circuitry within the first scan chain.

In general, in another aspect, this specification describes a method that includes providing a cell chain; using a first scan chain to test digital circuitry within a first portion of the cell chain; and using a second scan chain to test digital circuitry within a second portion of the cell chain. The first scan chain is further operable to test digital circuitry within the second scan chain and the second scan chain is further operable to test digital circuitry within the first scan chain.

Particular implementations can include one or more of the following features. The method can further include using the first scan chain to test digital circuitry within the second portion of the cell chain, and using the second scan chain to test digital circuitry within the first portion of the cell chain. Using the first scan chain and using the second scan chain can include using the first and second scan chains to test digital circuitry associated with one or more of microcontrollers, memories, logic, radio frequency (RF) components, or sensors. The method can further include switching the cell chain between a normal mode of operation and a cell chain test mode of operation. The method can also further include switching the first scan chain and the second scan chain between the cell chain test mode of operation and a scan chain test mode of operation. The method can further include sizing the first scan chain and the second scan chain to match a total number of circuits to be tested within the cell chain.

Implementations may provide one or more of the following advantages. A scan chain testing technique is provided that can quickly locate stuck-at faults in cell chains. In one implementation, a scan chain testing technique is provided that can also quickly locate stuck-at faults within a scan chain. In such an implementation, even if a scan chain is defective, cell chains within a digital circuit can still be tested for correct operation.

The details of one or more implementations are set forth in the accompanying drawings and the description below. Other features and advantages will be apparent from the description and drawings, and from the claims.

BRIEF DESCRIPTION OF SEVERAL VIEWS OF THE DRAWINGS

Like reference symbols in the various drawings indicate like elements.

DETAILED DESCRIPTION OF THE INVENTION

The present invention relates generally to testing the presence of faults in digital circuits. The following description is presented to enable one of ordinary skill in the art to make and use the invention and is provided in the context of a patent application and its requirements. Various modifications to the preferred implementations and the generic principles and feature described herein will be readily apparent to those skilled in the art. Thus, the present invention is not intended to be limited to the implementations shown but is to be accorded the widest scope consistent with the principles and features described herein.

Figure 1:
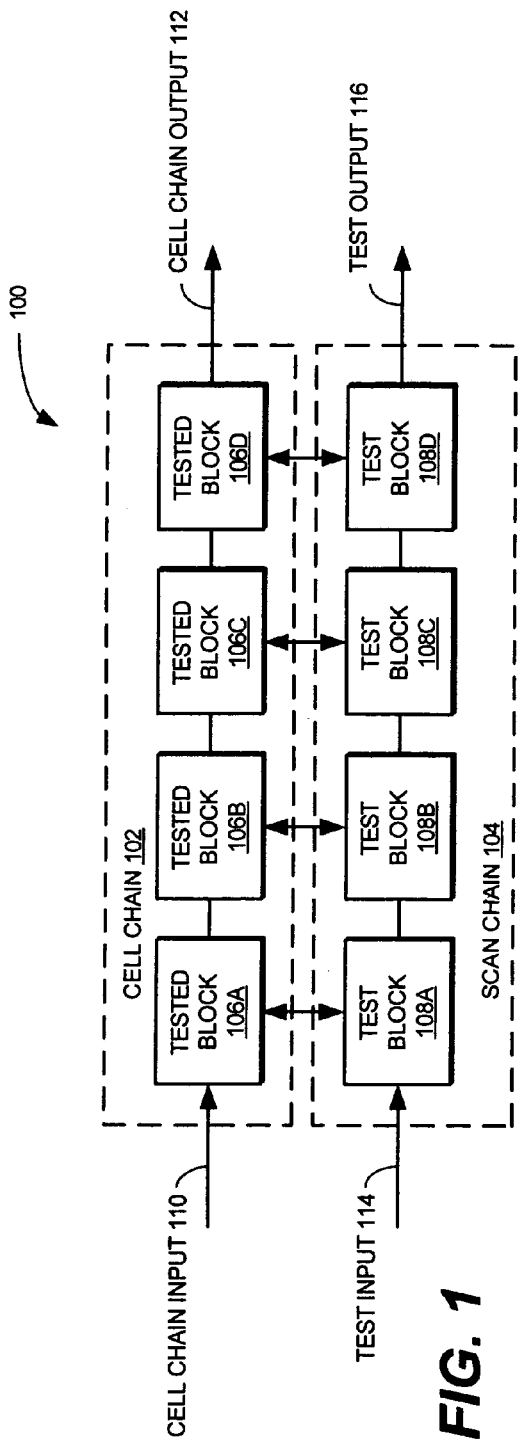
FIG. 1 is a block diagram of a scan chain test structure.

FIG. 1 shows a block diagram of a scan chain test structure 100. Scan chain test structure 100 includes a cell chain 102 and a scan chain 104.

Cell chain 102 includes tested blocks 106A-106D. Though four tested blocks are illustrated in FIG. 1 by way of example, cell chain 102 can contain a different number of tested blocks. During a normal mode of operation, inputs are received by cell chain 102 through a cell chain input 110, and an output of cell chain 102 is obtained through a cell chain output 112. In general, each tested block 106A-106D includes digital circuitry (not shown) that is operable to be tested by scan chain 104, as discussed in greater detail below. The digital circuitry can include circuitry associated with any digital circuit—e.g., microcontrollers, memories, logic, radio frequency (RF) components, and sensors.

In one implementation, scan chain 104 includes test blocks 108A-108D that each corresponds to tested blocks 106A-106D—i.e., a total number of test blocks within scan chain 104 can be scaled to match a total number of tested blocks within cell chain 102. During a test mode of operation, each test block 108A-108D permits the verification of correct operation of a corresponding tested block (e.g., tested blocks 106A-106D), as discussed in greater detail below. In one implementation, a test input is serially received by scan chain 104 through a test input 114, and results of a test are recovered though a test output 116 of scan chain 104. Test results can be analyzed by a user, e.g., a circuit designer, to determine whether the behavior of each tested block (e.g., tested blocks 106A-106D) is the one expected.

Figure 2:
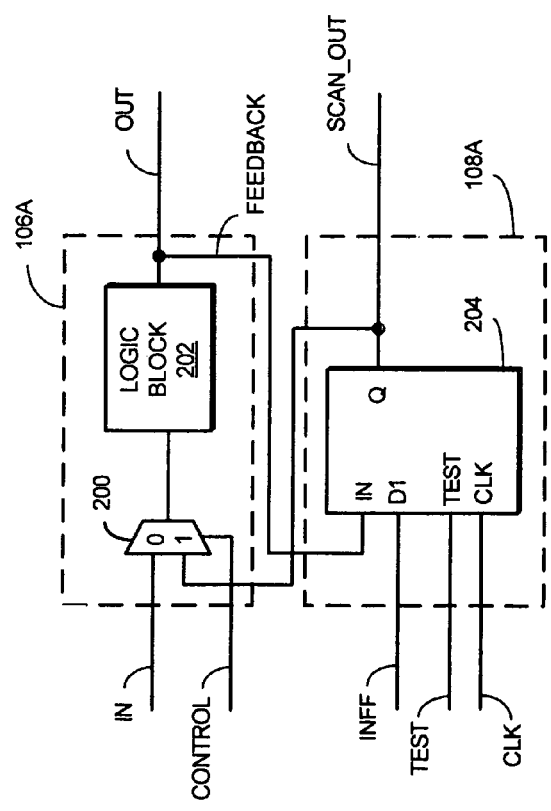
FIG. 2 is a schematic diagram of a tested block and a test block in the scan chain test structure of FIG. 1.

FIG. 2 illustrates one implementation of the interconnection between tested block 106A and test block 108A.

In one implementation, tested block 106A includes a multiplexer 200 and a logic block 202. Logic block 202 can include any type of digital circuitry. For example, logic block 202 can include one or more of standard cells, process structures, or logic structures. Multiplexer 200 permits switching between a normal mode of operation and a test mode of operation through a control input CONTROL of tested block 106A. For example, during the normal mode of operation, multiplexer 200 is controlled to pass an input value through an input IN of tested block 106A, and an output of logic block 202 is sent through an output OUT of tested block 106A. Output OUT of tested block 106A is coupled to an input of the next tested block (e.g., input IN of tested block 106B (not shown)).

In one implementation, test block 108A includes a scan flip flop 204. Scan flip flop 204 can include, for example, a D flip flop, an SR flip flop, a JK flip flop, or a T flip flop. Scan flip flop 204 is operable to latch one of two input values—a value received through an input INFF of test block 108A or a value received from output OUT of tested block 106A. Test block 108A further includes an input TEST, a clock input CLK, and an output SCAN_OUT. Output SCAN_OUT is coupled to an input of the next test block (e.g., input INFF of test block 108B (not shown)).

Test blocks 106B-106D and tested blocks 108B-108D can respectively be similarly interconnected as shown in FIG. 2. Such an interconnection between tested blocks 106A-106D and test blocks 108A-108D permits multiple fault detection all along cell chain 102 (FIG. 1). In particular, during a test mode of operation, scan flip flop 204 receives a test input through input INFF. Multiplexer 200 is controlled to pass the test input from scan flip flop 204 to logic block 202. A result from logic block 202 is recovered by scan flip flop 204 through a feedback input FEEDBACK. The result is then scanned out of scan flip flop 204 and observed through output SCAN_OUT.

Figure 3:
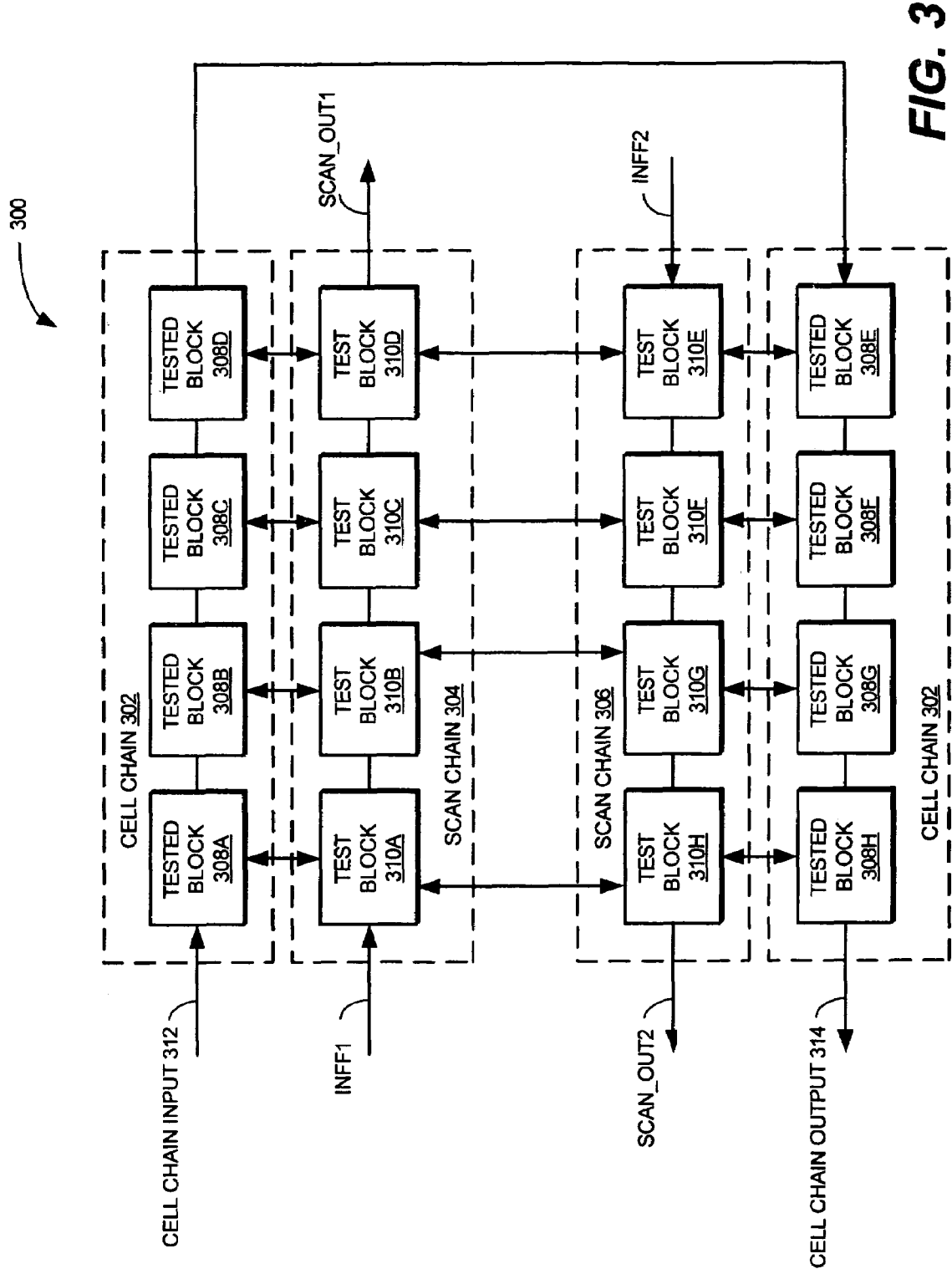
FIG. 3 is a block diagram of a scan chain test structure.

FIG. 3 shows a block diagram of a scan chain test structure 300. Scan chain test structure 300 includes a cell chain 302, a first scan chain 304 and a second scan chain 306. Cell chain 302 includes tested blocks 308A-308H, and has a cell chain input 312 and a cell chain output 314. Scan chain 304 includes test blocks 310A-310D, and has a scan input INFF1 and a scan output SCAN_OUT1. Scan chain 306 includes test blocks 310E-310H, and has a scan input INFF2 and a scan output SCAN_OUT2. As discussed above, each test block (e.g., test blocks 310A-310H permits the verification of correct operation of a corresponding tested block (e.g., tested blocks 308A-308H). In particular, scan chain 304 permits verification of a first portion of cell chain 302 (e.g., tested blocks 308A-308D), and scan chain 306 permits verification of a second portion of cell chain 302 (e.g., tested blocks 308E-308H).

In the implementation of FIG. 3, scan chain 306 is further operable to verify correct operation of scan chain 304. Likewise, scan chain 304 is operable to verify correct operation of scan chain 306. In one implementation, if scan chain 304 includes one or more defective test blocks, correct operation of one or more of tested blocks 308A-308D can be verified through scan chain 306. Similarly, if scan chain 306 includes one or more defective test blocks, correct operation of one or more of tested blocks 308E-308H can be verified through scan chain 304.

Figure 4:
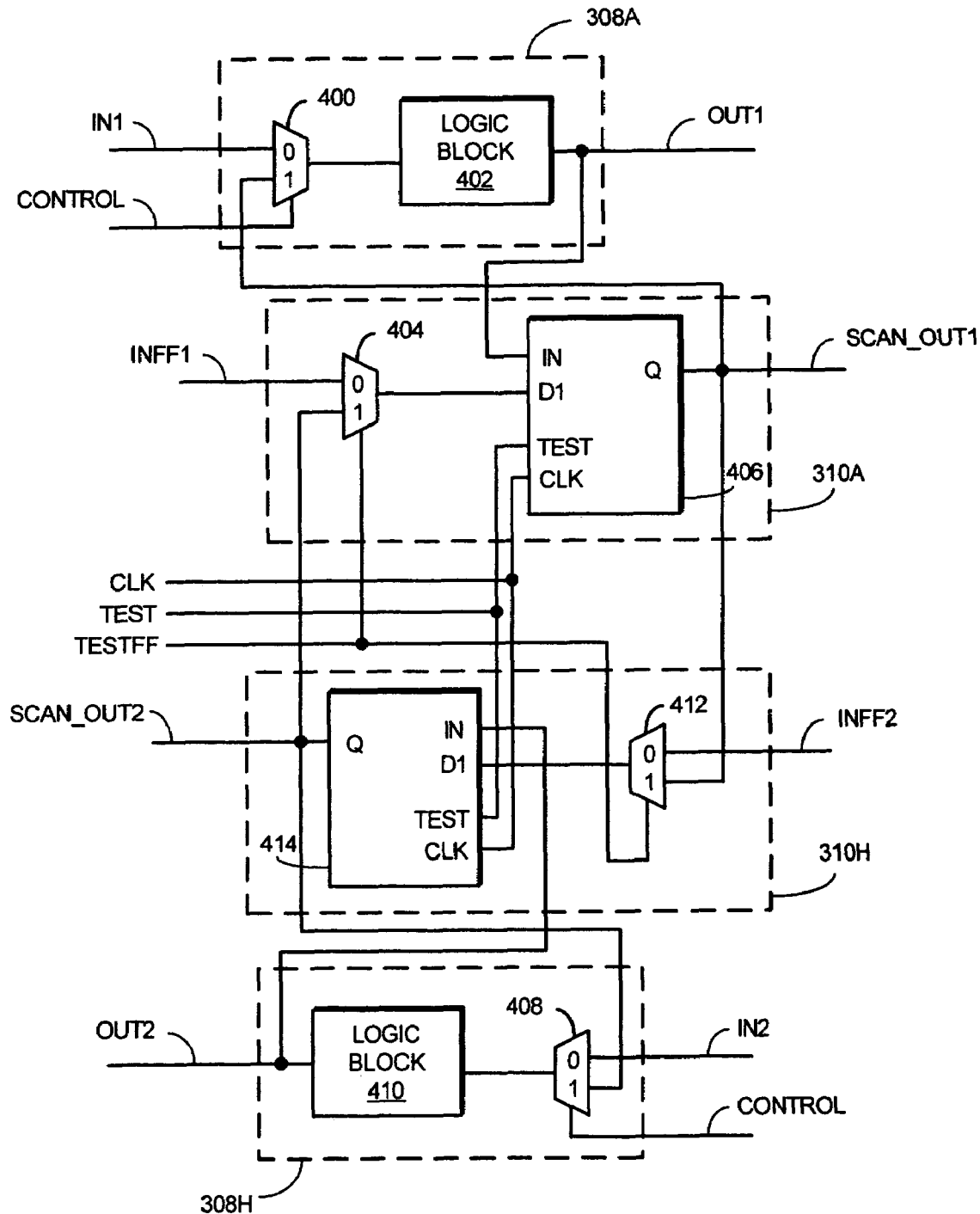
FIG. 4 is a schematic diagram of two tested blocks and two test blocks in the scan chain test structure of FIG. 3.

FIG. 4 illustrates one implementation of the interconnection between tested block 308A, test block 310A, test block 310H and tested block 308H.

In one implementation, tested block 308A includes a multiplexer 400, a logic block 402, an input IN1 and an output OUT1. Logic block 402 can include any type of digital circuitry, as discussed above. Multiplexer 400 permits switching between a normal mode of operation and a test mode of operation through a control input CONTROL of tested block 308A. Output OUT of tested block 308A is coupled to an input of the next tested block (e.g., input IN of tested block 308B (not shown)).

In one implementation, test block 310A includes a multiplexer 404 and a scan flip flop 406. Multiplexer 404 permits switching between a cell chain test mode (i.e., the test mode of operation discussed above) or a scan chain test mode. For example, during the cell chain test mode of operation multiplexer 404 is controlled to pass an input value through an input INFF1 of test block 310A, for subsequent transfer into tested block 308A. During the scan chain test mode, multiplexer 404 is controlled to pass an input value from an output of a scan flip flop 414 of test block 310H. Scan flip flop 406 is, therefore, operable to latch one of three input values—a value received through an input INFF1 of test block 310A, a value received from output OUT1 of tested block 308A, or a value received from output SCAN_OUT2 of test block 310H. Test block 310A further includes an input TEST, a clock input CLK, and an output SCAN_OUT1. Output SCAN_OUT1 is coupled to an input of the next test block (e.g., input INFF1 of test block 310B (not shown)).

Tested block 308H includes a multiplexer 408, a logic block 410, an input IN2 and an output OUT2. Test block 310H includes a multiplexer 412, a scan flip flop 414, a scan input INFF2 and a scan output SCAN_OUT2. Tested block 308H and test block 310H can respectively be similarly interconnected as tested block 308A and test block 310A.

Referring to FIGS. 3 and 4, in general, the following sets of test and tested blocks as follows: [tested block 308B, test block 310B, test block 310G, and tested block 308G], [tested block 308C, test block 310C, test block 310F, and tested block 308F], and [tested block 308D, test block 310D, test block 310E, and tested block 308E] can respectively be interconnected as shown in FIG. 4. Such an interconnection between each of set of test and tested blocks permits multiple fault detection all along cell chain 302 and scan chains 304-306, as discussed in greater detail below.

Figure 5:
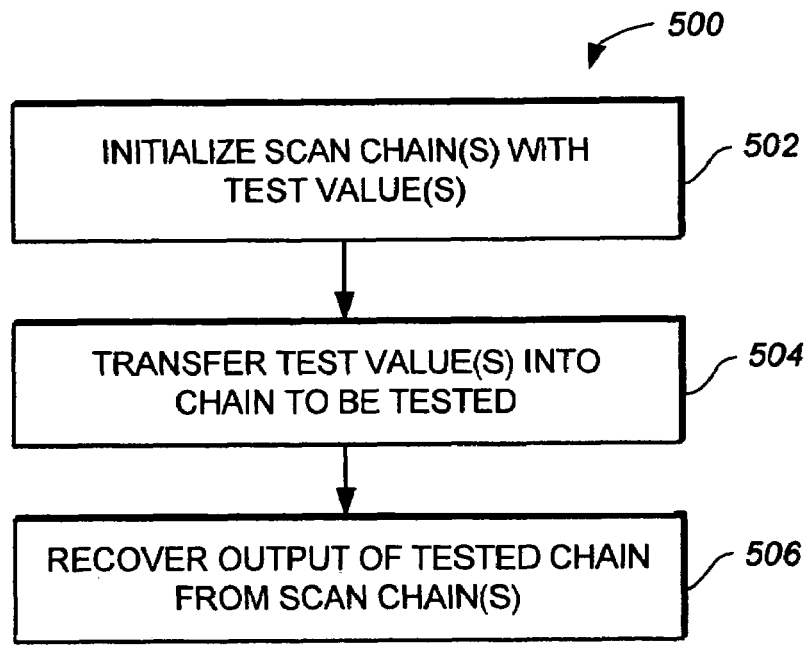
FIG. 5 illustrates a method for testing operation of a digital circuit.

FIG. 5 shows a method 500 for testing operation of a digital circuit (e.g., cell chain 302). One or more scan chains (e.g., scan chains 304-306) are initialized with one or more corresponding test values (step 502). The test values are transferred from the scan chain(s) into a chain to be tested (step 504). The chain to be tested can be a cell chain (e.g., cell chain 302) or a scan chain (e.g., scan chain 306). For example, in one implementation, test values are transferred into a first scan chain (e.g., scan chain 304) for testing of a second scan chain (e.g., scan chain 306). A result (or output) of the tested chain is recovered from the scan chain(s) (step 506). By analyzing the result, fault detection within the tested chain can be quickly identified and located as discussed in the examples below.

Cell Chain Test

Referring back to FIG. 3, an example test of cell chain 302 will now be discussed. According to this test, tested block 308A and tested block 308C are defective with stuck-at "0" faults.

Each scan flip flop within test blocks 310A-310H is initialized with a corresponding test input value. In this case, each scan flip flop is initialized with a test value of "1" (i.e., a logic value of "1"). Referring to FIG. 4, input INFF1 and INFF2 are, therefore, each set to "1" during initialization of scan chains 304-306. Also, control input CONTROL is set to "0", input TEST is set to "1", and input TESTFF is set to "0".

Once each scan flip flop is initialized with a test input value, the test input value is transferred from a given scan flip flop to a corresponding tested block. In one implementation, one clock period is used to transfer the test input value from a scan flip flop and recover a result (i.e., an output) from a corresponding tested block. In one implementation, during the transfer period, input CONTROL is set to "1", input TEST is set to "0", and input TESTFF is set to "0". Thus, during the transfer period, each logic block within cell chain 302 receives the test input values from a corresponding scan flip flop, and each scan flip flop is configured to latch an output from a corresponding logic block.

In one implementation, during the recovery period, input CONTROL is set to "0", input TEST is set to "1", and input TESTFF is set to "0". Results of the testing of logic blocks within tested blocks 308A-308D are scanned from scan chain 304 through output SCAN_OUT1, and results of the testing of logic blocks within tested blocks 308E-308H are scanned from scan chain 306 through output SCAN_OUT2.

Figure 6:
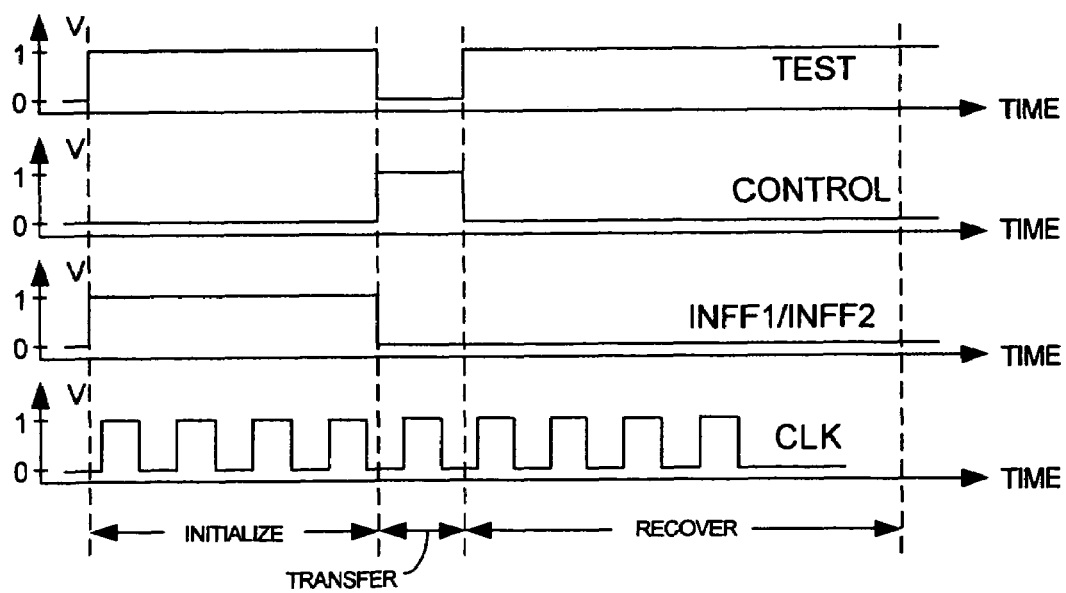
FIG. 6 illustrates an example timing diagram of test signals in the scan chain test structure of FIG. 3.

Referring to FIG. 6, a timing diagram 600 is shown of inputs TEST, CONTROL, INFF1, INFF2, and CLK during the initialization, transfer, and recovery periods for testing of a cell chain (in one implementation).

Figure 7:
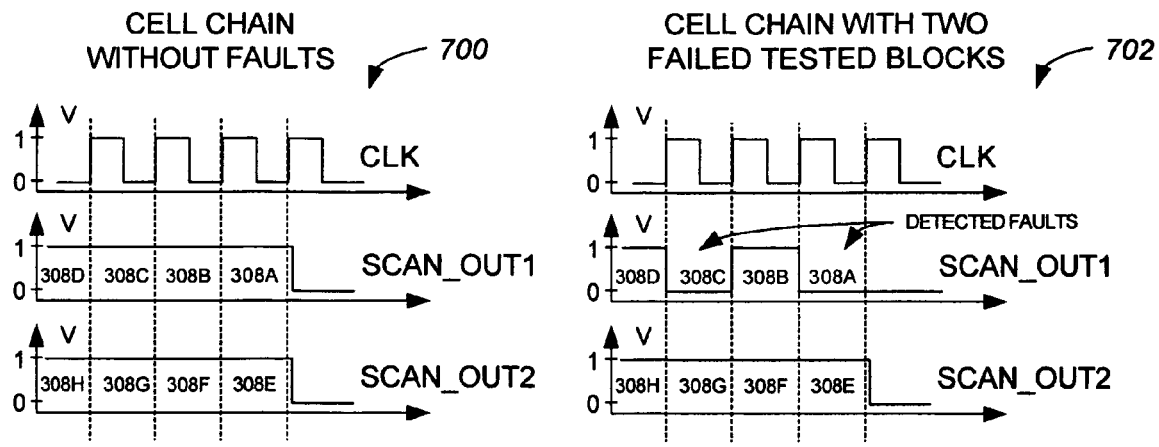
FIG. 7 illustrates an example test result of a digital circuit using the scan chain test structure of FIG. 3.

Referring to FIG. 7, example test results 700, 702 of cell chain 302 are shown. If cell chain 302 did not contain any defective logic blocks, outputs SCAN_OUT1 and SCAN_OUT2 would appear as shown in test result 700—i.e., the logic value of "1" transferred into each logic block would appear at an output of the corresponding logic block. However, in the example above, tested block 308A and tested block 308C are stuck-at "0". A test result based on such an example is illustrated in test result 702. As shown, tested block 308A and tested block 308C each have a logic value of "0" which is not the expected result.

Figure 8:
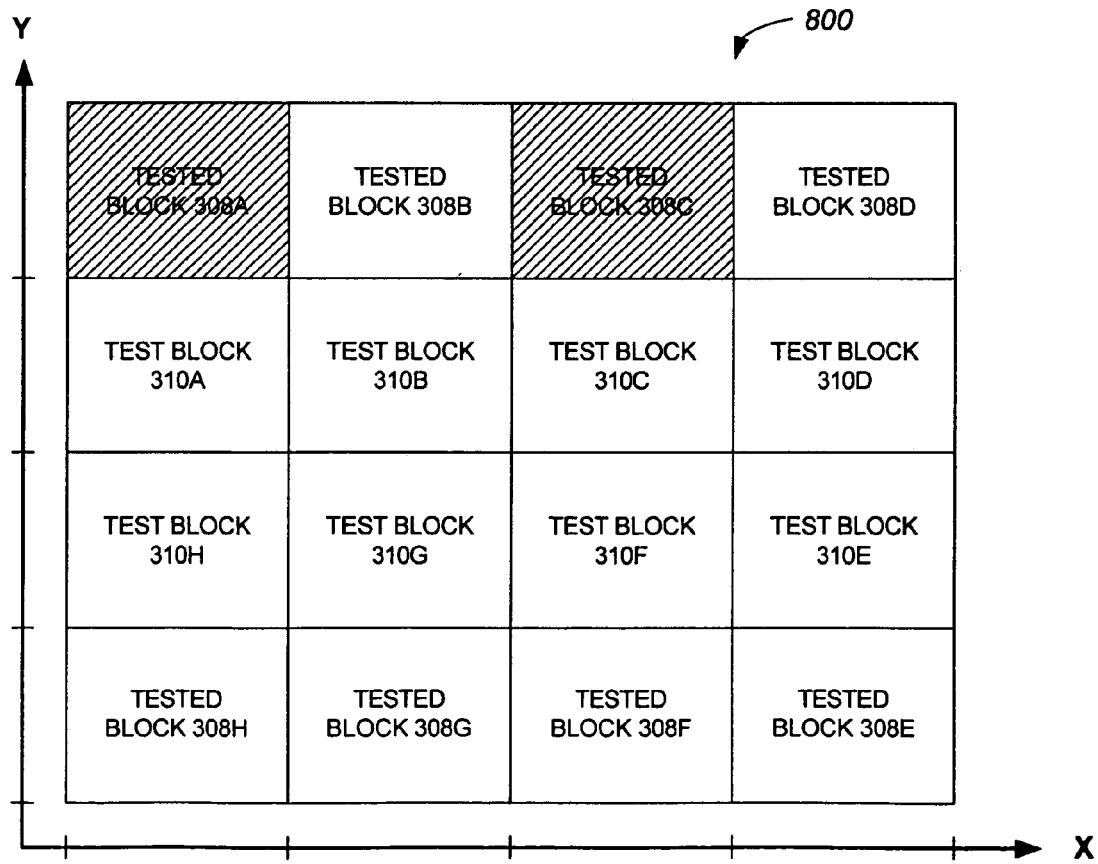
FIG. 8 illustrates the location of faults in a silicon layout corresponding to the example of FIG. 7.

FIG. 8 illustrates a layout 800 of scan chain test structure 300 (FIG. 3) in silicon, according to X, Y coordinates. Based on the test results shown by SCAN_OUT1 and SCAN_OUT2 (in test result 702 (FIG. 7)), faults in silicon can be quickly located by referring to layout 800. The cross hatched locations in layout 800 indicate locations where a defective logic block is located. In one implementation, a computer program is used to identify locations of faults within silicon. Once the fault locations are identified process engineers, for example, can make changes to the layout of a given digital circuit to avoid any defects.

Scan Chain Test

An example test of scan chain 306 shown in FIG. 3 will now be discussed. According to this test, test block 310F and test block 310H are defective with stuck-at "0" faults.

Each scan flip flop within test blocks 310A-310D of scan chain 304 is initialized with a corresponding test input value. In this case, each scan flip flop within test blocks 310A-310D is initialized with a test value of "1". Input INFF1 is set to "1" during initialization of scan chain 304. Also, control input CONTROL is set to "0", input TEST is set to "1", and input TESTFF is set to "0".

Once each scan flip flop within test blocks 310A-310D is initialized with a test input value, the test input value is transferred from a given scan flip flop within test blocks 310A-310D to a corresponding scan flip flop within scan chain 306. In one implementation, two clock periods are used to transfer the test input value from a scan flip flop (in the test scan chain) and recover a result (i.e., an output) from a corresponding scan flip flop (in the tested scan chain). That is, one clock period for transfer, and one clock period is used for recovery. In one implementation, during the transfer period, input CONTROL is set to "1", input TEST is set to "0", and input TESTFF is set to "0". Thus, during the transfer period, each scan flip flop within scan chain 306 receives the test input values from a corresponding scan flip flop within scan chain 304, and each scan flip flop within scan chain 304 is configured to latch an output from a corresponding scan flip flop within scan chain 306.

In one implementation, during the recovery period, input CONTROL is set to "1", input TEST is set to "1", and input TESTFF is set to "1". Results of the testing of scan flip flops within test blocks 310E-310H are scanned from scan chain 304 through output SCAN_OUT1.

Figure 9:
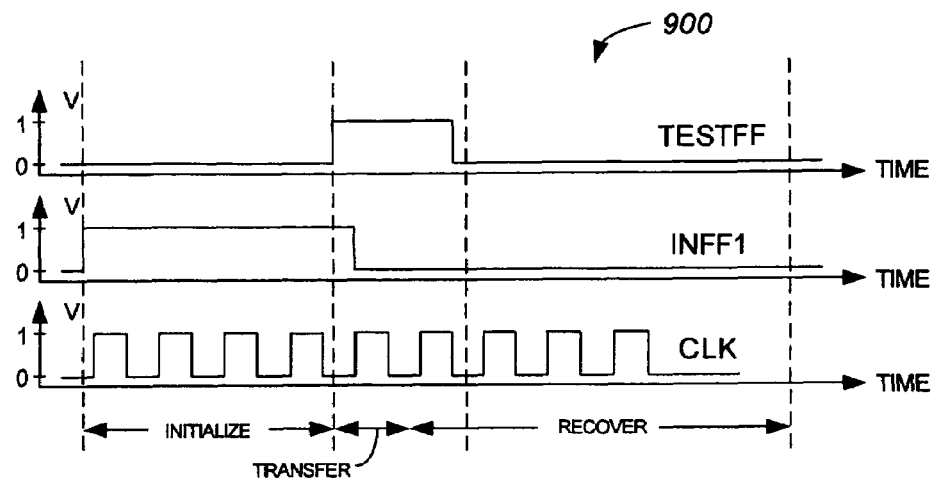
FIG. 9 illustrates an example timing diagram of test signals in the scan chain test structure of FIG. 3.

Referring to FIG. 9, a timing diagram 900 is shown of inputs TESTFF, INFF1, and CLK during the initialization, transfer, and recovery periods for testing of a scan chain (in one implementation).

Figure 10:
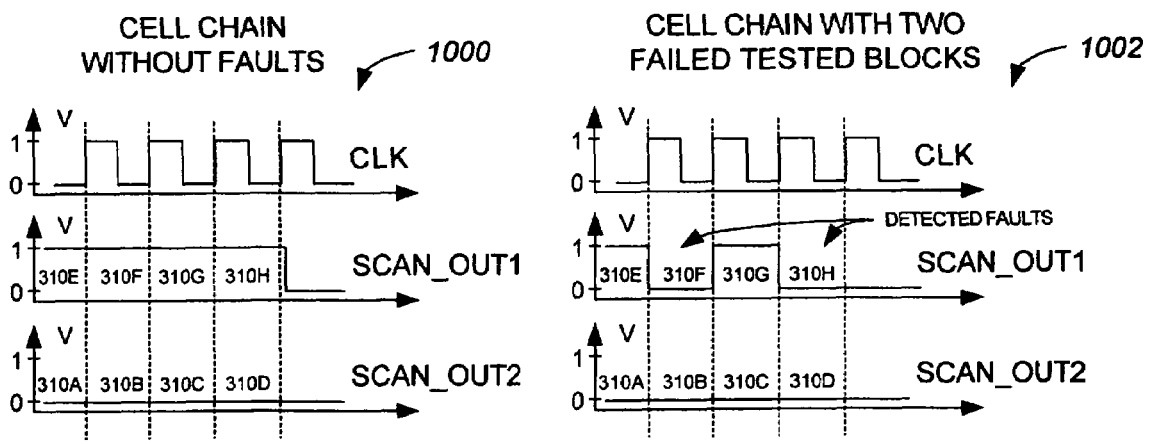
FIG. 10 illustrates an example test result of a digital circuit using the scan chain test structure of FIG. 3.

Referring to FIG. 10, example test results 1000, 1002 of scan chain 306 are shown. If scan chain 306 did not contain any defective scan flip flops, outputs SCAN_OUT1 and SCAN_OUT2 would appear as shown in test result 1000—i.e., the logic value of "1" transferred into each scan flip flop of test blocks 310E-310H would appear at an output of the corresponding scan flip flop. However, in the example above, test block 310F and test block 310H are stuck-at "0". A test result based on such an example is illustrated in test result 1002. As shown, test block 310F and test block 310H each have a logic value of "0" which is not the expected result.

Figure 11:
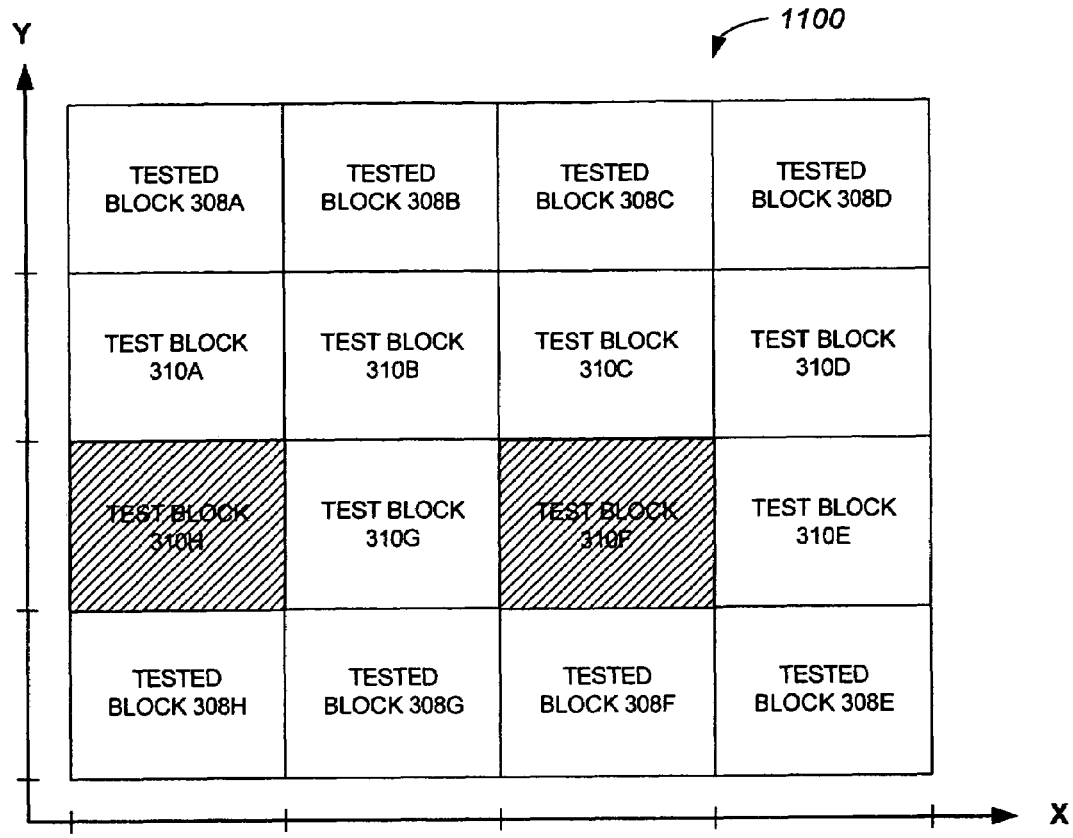
FIG. 11 illustrates the location of faults in a silicon layout corresponding to the example of FIG. 10.

FIG. 11 illustrates a layout 1100 of scan chain test structure 300 (FIG. 3) in silicon, according to X, Y coordinates. Based on the test results shown by SCAN_OUT1 (in test result 1002 (FIG. 10)), faults in silicon can be located by referring to layout 1100. The cross hatched locations in layout 1100 indicate locations where a defective scan flip flop is located (e.g., within test block 310F and test block 310H).

Cell Chain Test When a Scan Chain is Defective

Referring again to FIG. 3, an example test of cell chain 302 when scan chain 306 is defective will now be discussed. According to this test, test block 310F and test block 310H of scan chain 306 are known to be defective with stuck-at "0" faults. In addition, tested blocks 308E-308G are defective with stuck-at "0" faults.

Each scan flip flop within test blocks 310A-310D of scan chain 304 is initialized with a corresponding test input value. In this case, each scan flip flop within test blocks 310A-310D is initialized with a test value of "1". Input INFF1 is set to "1" during initialization of scan chain 304. Also, control input CONTROL is set to "1", input TESTFF is set to "0", and input TEST is set to "1".

Once each scan flip flop within test blocks 310A-310D is initialized with a test input value, the test input value is transferred from a given scan flip flop within test blocks 310A-310D to logic blocks within tested blocks 308E-308H of cell chain 302. In one implementation, three clock periods are used to transfer the test input value from a scan flip flop (in scan chain 304) and recover a result (i.e., an output) from a corresponding logic block (in tested blocks 308E-308H). In particular, one clock period is used to transfer the test input value from scan chain 304 into scan chain 306 (input CONTROL is set to "0", input TEST is set to "1", and input TESTFF is set to "1"). The second clock period is used to test logic blocks within tested blocks 308E-308H (input CONTROL is set to "0", input TEST is set to "0", and input TESTFF is set to "1". The third clock period is used for scan chain 304 to recover the test results from scan chain 306 (input CONTROL is set to "0", input TEST is set to "1", and input TESTFF is set to "1").

Figure 12:
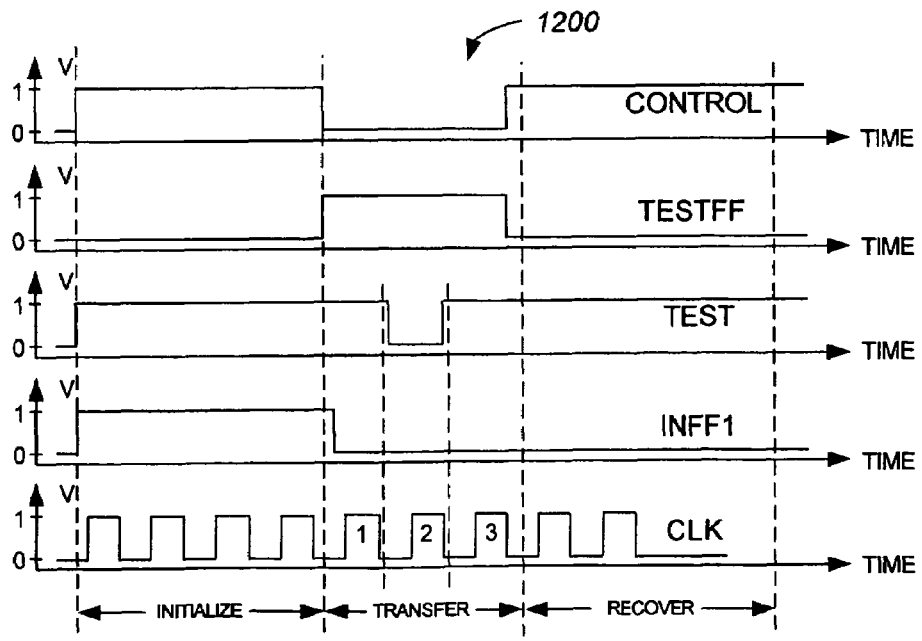
FIG. 12 illustrates an example timing diagram of test signals in the scan chain test structure of FIG. 3.

Referring to FIG. 12, a timing diagram 1200 is shown of inputs CONTROL, TESTFF, TEST, INFF1, and CLK during the initialization, transfer, and recovery periods for testing of a cell chain when a scan chain is known to be defective (in one implementation).

Figure 13:
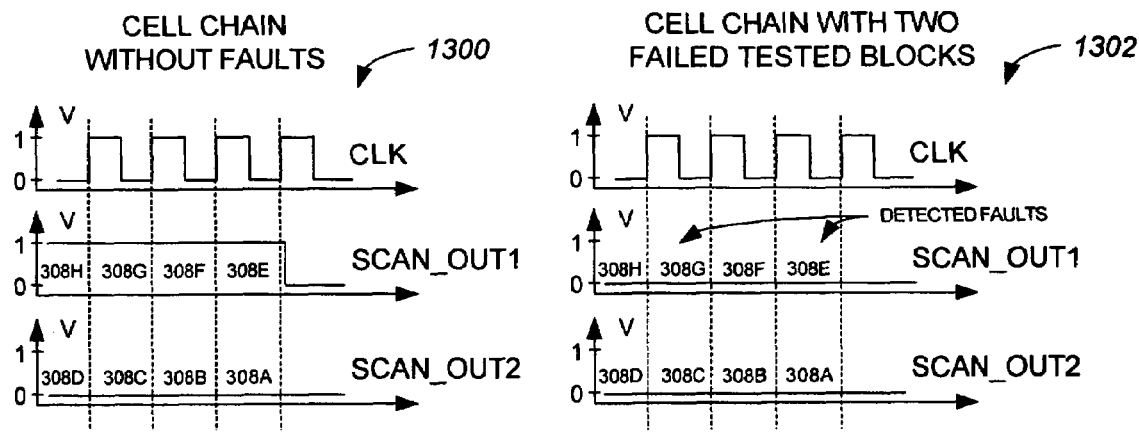
FIG. 13 illustrates an example test result of a digital circuit using the scan chain test structure of FIG. 3.

Referring to FIG. 13, example test results 1300, 1302 of logic blocks within tested blocks 308E-308H are shown. If logic blocks within tested blocks 308E-308H did not contain any defective logic blocks, outputs SCAN_OUT1 and SCAN_OUT2 would appear as shown in test result 1300—i.e., the logic value of "1" transferred into each logic block within tested blocks 308E-308H would appear at an output of the corresponding logic block. However, in the example above, tested blocks 308E-308G are stuck-at "0". A test result based on such an example is illustrated in test result 1302. As shown, each of tested blocks 308E, 308G have a logic value of "0" which is not the expected result. Likewise, tested blocks 308F, 308H have a logic value of "0" which is not the expected result. However, it is known that tested blocks 308F, 308H cannot be properly analyzed because test blocks 310F, 310H are known to be defective.

Figure 14:
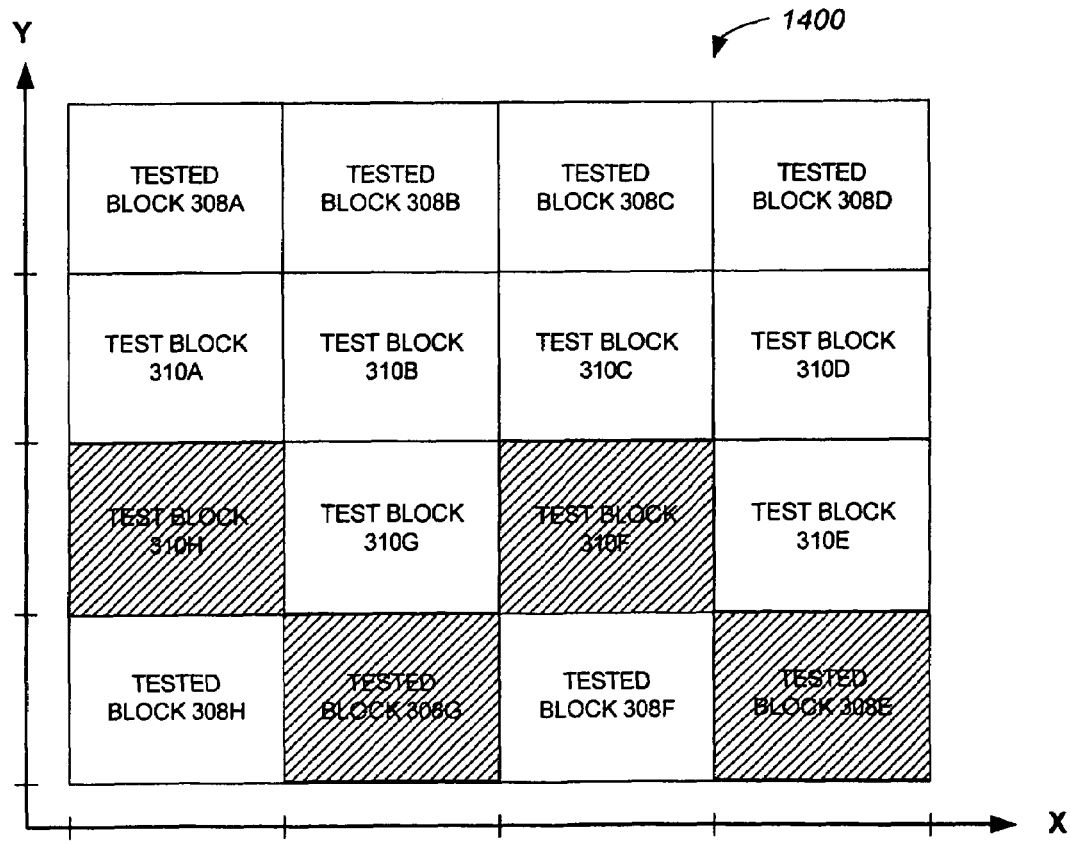
FIG. 14 illustrates the location of faults in a silicon layout corresponding to the example of FIG. 13.

FIG. 14 illustrates a layout 1400 of scan chain test structure 300 (FIG. 3) in silicon, according to X, Y coordinates. Based on the test results shown by SCAN_OUT1 (in test result 1302 (FIG. 13)), faults in silicon can be located by referring to layout 1400. The cross hatched locations in layout 1400 indicate locations where a defective scan flip flop or logic block is located (e.g., within test block 310F, test block 310H, tested block 308E and tested block 308G).

Figure 15:
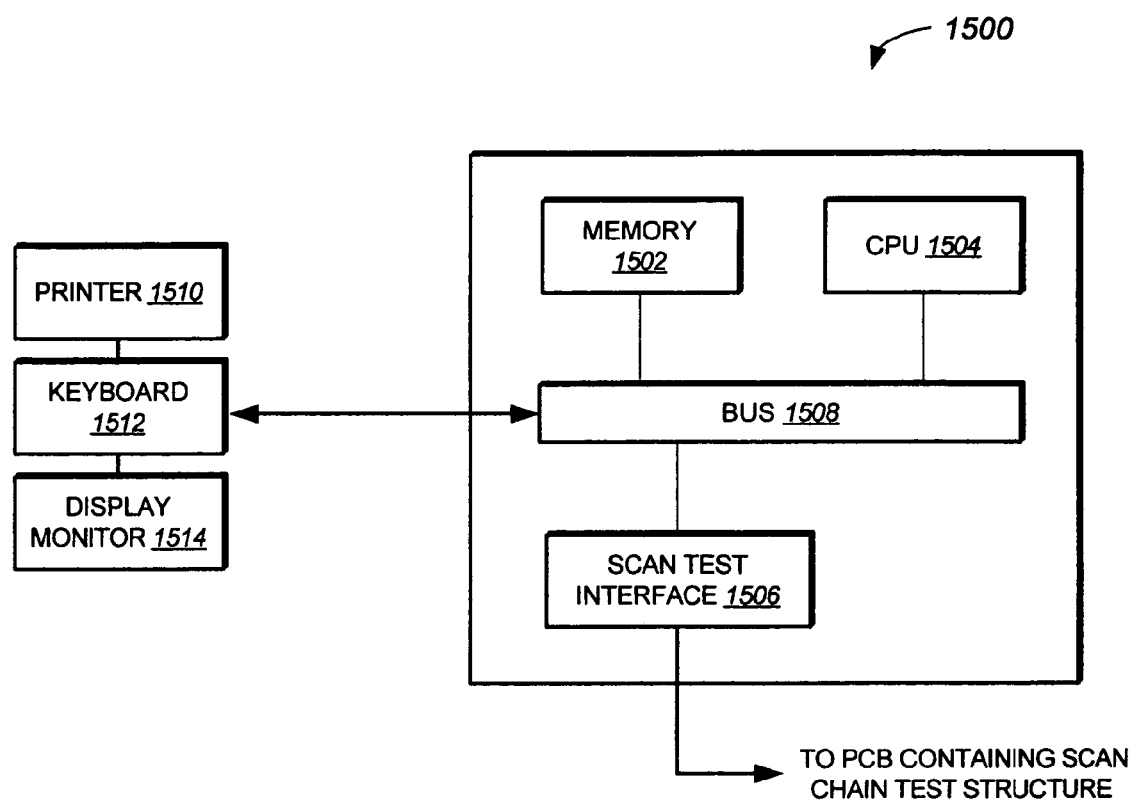
FIG. 15 illustrates a test system.

FIG. 15 illustrates a test system 1500 that can be coupled to scan chain test structure 100 (FIG. 1) or scan chain test structure 300 (FIG. 3). In one implementation, test system 1500 includes a memory 1502, a central processing unit (CPU) 1504, a scan test interface 1506 and a bus 1508. Test system 1500 can further include peripheral devices such as a printer 1510, a keyboard 1512 and a display monitor 1514.

A user using test system 1500 can generate one or more test inputs of a pre-determined length to test a digital circuit. The generated test inputs can be stored in memory 1502. In general, during testing, test inputs are sent to scan test interface 1506 through bus 1508. Scan test interface 1506 permits test system 1500 to be coupled to a printed circuit board (not shown) that contains a scan test structure (e.g., scan chain test structure 300). Results of tests on digital circuitry within the scan chain are viewable by a user on display monitor 1514.

Various implementations for testing correct operation of digital circuits have been described. Nevertheless, one or ordinary skill in the art will readily recognize that there that various modifications may be made to the implementations, and any variation would be within the spirit and scope of the present invention. For example, though example tests described above were implemented to locate stuck-at "0" faults, other types of faults can be tested—e.g., stuck-at "1" faults. Accordingly, many modifications may be made by one of ordinary skill in the art without departing from the spirit and scope of the following claims.

We claim:

1. A scan chain structure comprising:
   a cell chain;
   a first scan chain to test digital circuitry within a first portion of the cell chain; and
   a second scan chain to test digital circuitry within a second portion of the cell chain, wherein the first scan chain is further operable to test digital circuitry within the second scan chain and the second scan chain is further operable to test digital circuitry within the first scan chain, and wherein the first scan chain is further operable to test digital circuitry within the second portion of the cell chain through the second scan chain, and the second scan chain is further operable to test digital circuitry within the first portion of the cell chain through the first scan chain.

2. The scan chain test structure of claim 1, wherein the digital circuitry within the cell chain includes digital circuitry associated with one or more of microcontrollers, memories, logic, radio frequency (RF) components, or sensors.

3. The scan chain test structure of claim 1, wherein the cell chain includes a multiplexer to switch the cell chain between a normal mode of operation and a cell chain test mode of operation.

4. The scan chain test structure of claim 3, wherein the first scan chain and the second scan chain each include a multiplexer to respectively switch the first scan chain and the second scan chain between the cell chain test mode of operation and a scan chain test mode of operation.

5. The scan chain test structure of claim 1, wherein sizes of the first scan chain and the second scan chain are scalable to match a total number of circuits to be tested within the cell chain.

6. The scan chain test structure of claim 1, wherein in response to the first scan chain testing digital circuitry within the second portion of the cell chain through the second scan chain, three clock periods are required for the first scan chain to recover an output from the digital circuitry within the second portion of the cell chain.

7. A test system comprising:
a central processing unit;
a memory coupled to the central processing unit, the memory operable to store one or more test inputs of a pre-determined length; and
a scan test interface coupled to a printed circuit board, wherein the printed circuit board includes a scan chain structure comprising,
a cell chain;
a first scan chain to test digital circuitry within a first portion of the cell chain; and
a second scan chain to test digital circuitry within a second portion of the cell chain,
wherein the first scan chain is further operable to test digital circuitry within the second scan chain and the second scan chain is further operable to test digital circuitry within the first scan chain, and wherein the first scan chain is further operable to test digital circuitry within the second portion of the cell chain through the second scan chain, and the second scan chain is further operable to test digital circuitry within the first portion of the cell chain through the first scan chain, and each of the first scan chain and the second scan chain is operable to receive the test input through the scan test interface.

8. The test system of claim 7, wherein the digital circuitry within the cell chain includes digital circuitry associated with one or more of microcontrollers, memories, logic, radio frequency (RF) components, or sensors.

9. The test system of claim 7, wherein the cell chain includes a multiplexer to switch the cell chain between a normal mode of operation and a cell chain test mode of operation.

10. The test system of claim 9, wherein the first scan chain and the second scan chain each include a multiplexer to respectively switch the first scan chain and the second scan chain between the cell chain test mode of operation and a scan chain test mode of operation.

11. The test system of claim 7, wherein sizes of the first scan chain and the second scan chain are scalable to match a total number of circuits to be tested within the cell chain.

12. The test system of claim 7, wherein in response to the first scan chain testing digital circuitry within the second portion of the cell chain through the second scan chain, three clock periods are required for the first scan chain to recover an output from the digital circuitry within the second portion of the cell chain.

13. A method for testing correct operation of a digital circuit, the method comprising:
providing a cell chain;
using a first scan chain to test digital circuitry within a first portion of the cell chain; and
using a second scan chain to test digital circuitry within a second portion of the cell chain,
wherein the first scan chain is further operable to test digital circuitry within the second scan chain and the second scan chain is further operable to test digital circuitry within the first scan chain, and
wherein the first scan chain is further operable to test digital circuitry within the second portion of the cell chain through the second scan chain, and the second scan chain is further operable to test digital circuitry within the first portion of the cell chain through the first scan chain.

14. The method of claim 13, wherein using the first scan chain and using the second scan chain includes using the first and second scan chains to test digital circuitry associated with one or more of microcontrollers, memories, logic, radio frequency (RF) components, or sensors.

15. The method of claim 13, further comprising switching the cell chain between a normal mode of operation and a cell chain test mode of operation.

16. The method of claim 15, further comprising switching the first scan chain and the second scan chain between the cell chain test mode of operation and a scan chain test mode of operation.

17. The method of claim 13, further comprising sizing the first scan chain and the second scan chain to match a total number of circuits to be tested within the cell chain.

18. The method of claim 13, wherein in response to the first scan chain testing digital circuitry within the second portion of the cell chain through the second scan chain, three clock periods are required for the first scan chain to recover an output from the digital circuitry within the second portion of the cell chain.

* * * * *